United States Patent
Henderson

(10) Patent No.: US 10,031,178 B2
(45) Date of Patent: Jul. 24, 2018

(54) PORTABLE VACUUM CHAMBER AND AN ASSOCIATED AUTOMATED TEST SYSTEM AND METHOD FOR THE TESTING OF ELECTRONIC DEVICES

(71) Applicant: Keysight Technologies, Inc., Minneapolis, MN (US)

(72) Inventor: David Henderson, Santa Rosa, CA (US)

(73) Assignee: Keysight Technologies, Inc., Santa Rosa, CA (US)

( * ) Notice: Subject to any disclaimer, the term of this patent is extended or adjusted under 35 U.S.C. 154(b) by 366 days.

(21) Appl. No.: 14/692,693

(22) Filed: Apr. 21, 2015

(65) Prior Publication Data

US 2016/0313384 A1    Oct. 27, 2016

(51) Int. Cl.
 *G01R 31/28*    (2006.01)

(52) U.S. Cl.
 CPC ..... *G01R 31/2881* (2013.01); *G01R 31/2862* (2013.01)

(58) Field of Classification Search
 CPC .... G01R 31/003; G01R 1/02; G01R 31/2881; G01R 31/2862
 See application file for complete search history.

(56) References Cited

U.S. PATENT DOCUMENTS

| | | | |
|---|---|---|---|
| 5,039,938 A | 8/1991 | Kohnen et al. | |
| 5,325,309 A * | 6/1994 | Halaviati | G01R 31/305 703/15 |
| 7,015,712 B1 | 3/2006 | Liu | |
| 7,625,227 B1 | 12/2009 | Henderson et al. | |
| 7,721,608 B2 | 5/2010 | Henderson et al. | |
| 8,079,267 B2 | 12/2011 | Henderson et al. | |
| 8,933,703 B2 | 1/2015 | Henderson et al. | |

(Continued)

FOREIGN PATENT DOCUMENTS

| | | |
|---|---|---|
| CN | 103529380 A | 1/2014 |
| WO | 2012014899 A1 | 2/2012 |

OTHER PUBLICATIONS

Co-pending U.S. Appl. No. 14/539,945, filed Nov. 12, 2014.

(Continued)

*Primary Examiner* — Melissa Koval
*Assistant Examiner* — Courtney McDonnough

(57) ABSTRACT

A testing system includes a vacuum pump, testing equipment and a vibration device. A vacuum tray is configured to provide relative movement between a DUT and the vacuum pump, testing equipment and the vibration device. The vacuum tray includes a vacuum chamber configured to define a sealed vacuum environment around the DUT, and a DUT support carried by the vacuum chamber and configured to support the DUT within the chamber during testing thereof. The DUT support includes a pedestal configured to hold the DUT within the chamber during vibration testing, and an extension that extends outside the vacuum chamber and is configured to connect to the vibration device. An electrical test interface unit is carried by the vacuum chamber and configured to connect between the DUST and the test equipment, and a vacuum interface is carried by the vacuum chamber and configured to connect to the vacuum pump.

20 Claims, 8 Drawing Sheets

(56) References Cited

U.S. PATENT DOCUMENTS

| | | | |
|---|---|---|---|
| 2004/0036465 A1* | 2/2004 | Siefers | G01R 1/0416 324/754.16 |
| 2009/0033338 A1* | 2/2009 | Henderson | G01R 31/2849 324/555 |
| 2013/0214809 A1 | 8/2013 | Nakamura et al. | |

OTHER PUBLICATIONS

Office Action dated Sep. 28, 2016 in U.K. Patent Application No. 1606866.0.
English language machine translation of CN103529380, published Jan. 22, 2014.
English language abstract of WO2012014899, published Feb. 2, 2012.
Office Action dated Dec. 22, 2017 in U.K. Patent Application No. 1606866.0, 3 pages.

* cited by examiner

PORTABLE VACUUM CHAMBER AND AN ASSOCIATED AUTOMATED TEST SYSTEM AND METHOD FOR THE TESTING OF ELECTRONIC DEVICES

BACKGROUND

It is common practice to connect electronic circuits and devices (herein called DUTs) to test stations for the purpose of verifying the integrity of the DUT. The testing routines of each device are different for each DUT since each test routine is dependent upon the nature of the DUT. As devices become more complex, so does the test routine employed for verification of proper operation. In many situations, the test routines extend to vibration testing as well as temperature (hot as well as cold) testing. Thus, it may be necessary to connect each DUT to one or more test stations and to make proper electrical contact between the test station and the DUT. When the DUT is to be electrically tested while being vibrated, it is necessary to make both electrical connection to the DUT as well as a mechanical connection to a vibration mechanism. In some situations it is also necessary to perform the electrical testing (and sometimes both electrical and vibration testing) while the DUT is being subjected to various environmental factors, such as, for example, heat and cold.

Compounding the problem is the fact that different devices have different connection terminals which must be electrically and physically mated with the various inputs/outputs of the test station. Traditionally, these connections are made with cords having one end adapted for physical mating with the DUT and the other end adapted for mating with the test station. These cords then must be manually connected, usually at both ends. Compounding the problem even further, is the fact that when environmental testing or vibration testing is being performed, the cords and/or connectors have a physical presence within the environmental chamber surrounding the DUT. Thus the cords and/or connectors are subjected to varying test conditions as the temperatures and device movement (or other environmental factors) change, thereby allowing for possible variations in test results.

During the development and manufacture of electronic and mechanical devices it is often necessary to connect these DUTs to a test station for the purpose of verifying their integrity. It is often necessary to connect these DUTs to multiple test stations and to perform electrical and mechanical testing while subjecting the DUTs to the vacuum environments of high altitude or space.

In view of various shortcomings of conventional approaches, there may be a general need for systems and methods that include the use of a vacuum chamber which contains a DUT and incorporates electrical test interface units. This vacuum chamber may also incorporate a thermal and/or a vibration DUT stimulus.

SUMMARY

In accordance with a representative embodiment, a vacuum tray is for use in testing a device under test (DUT) in a testing system. The vacuum tray includes a vacuum chamber configured to define a sealed vacuum environment around a DUT, and a DUT support carried by the vacuum chamber and configured to support the DUT within the vacuum chamber during testing thereof. At least one electrical test interface unit is carried by the vacuum chamber and configured to connect between the DUT and test equipment of the testing system. A vacuum interface is carried by the vacuum chamber and configured to connect to a vacuum pump of the testing system.

The vacuum chamber may include a sealable access door configured to allow access for loading and unloading DUTs for testing. The vacuum chamber may be a vessel made of aluminum, steel and/or stainless steel, for example.

The DUT support may include a pedestal configured to hold the DUT within the vacuum chamber during vibration testing. The DUT support may include an extension, coupled to the pedestal and extending outside the vacuum chamber, and configured to connect to a vibration device of the testing system. The extension may include a vibration engagement interface, and the vacuum chamber may include a sealing extension passage that, together with the vibration engagement interface, provides a seal mechanism configured to allow the pedestal to move between a rest position, when not engaged with the vibration testing device, and a lifted position when engaged with the vibration testing device.

The electrical test interface unit may be a personality module configured to provide for electrical connection with the DUT, provide for electrical connection to the test equipment of the testing system, and provide conditioning information for controlling parameters to be used by the test equipment for testing the DUT.

A base may be included to support the vacuum chamber and the electrical test interface unit, and is configured to provide relative movement between the vacuum tray and the test equipment of the testing system.

Another embodiment is directed to a testing system for testing a device under test (DUT). The testing system includes a vacuum pump, testing equipment and a vibration device. At least one vacuum tray is configured to provide relative movement between the DUT and the vacuum pump, testing equipment and the vibration device, the vacuum tray comprising a vacuum chamber configured to define a sealed vacuum environment around the DUT, and a DUT support carried by the vacuum chamber and configured to support the DUT within the chamber during testing thereof. The DUT support includes a pedestal configured to hold the DUT within the vacuum chamber during vibration testing, and an extension that extends outside the vacuum chamber and is configured to connect to the vibration device. At least one electrical test interface unit is carried by the vacuum chamber and configured to connect between the DUT and the test equipment, and a vacuum interface is carried by the vacuum chamber and configured to connect to the vacuum pump.

Another embodiment is directed to a method for testing a device under test (DUT). The method includes carrying a DUT in a vacuum tray configured to provide relative movement between the DUT and a vacuum pump, testing equipment and a vibration device, and including supporting the DUT within a vacuum chamber, during testing thereof, on a DUT support that includes a pedestal to hold the DUT within the chamber during vibration testing, and an extension that extends outside the vacuum chamber and connects to the vibration device. The method further includes: controlling pressure within the vacuum chamber by connecting the vacuum pump to a vacuum interface carried by the vacuum chamber and creating a sealed vacuum environment around the DUT; performing electrical testing of the DUT, within the sealed vacuum environment, by communicating test signals between the DUT and the test equipment via at least one electrical test interface unit carried by the vacuum chamber; and performing vibration testing of the DUT, within the vacuum sealed environment, by engaging the vibration device with the extension of the DUT support.

The method may include loading and unloading the DUT for testing via a sealable access door in the vacuum chamber.

Embodiments may include the use of a frame defining at least one storage position and at least one test position for the vacuum tray. The vacuum pump, testing equipment and the vibration device may be associated with the frame at the test position.

Also, embodiments may include transporting the vacuum tray between the storage position and the test position with a transport vehicle.

The present embodiments provide devices, systems and methods that include the use of a portable vacuum chamber which contains a DUT and incorporates an electrical test interface unit, and may also include the use a thermal and/or vibration DUT stimulus.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1:
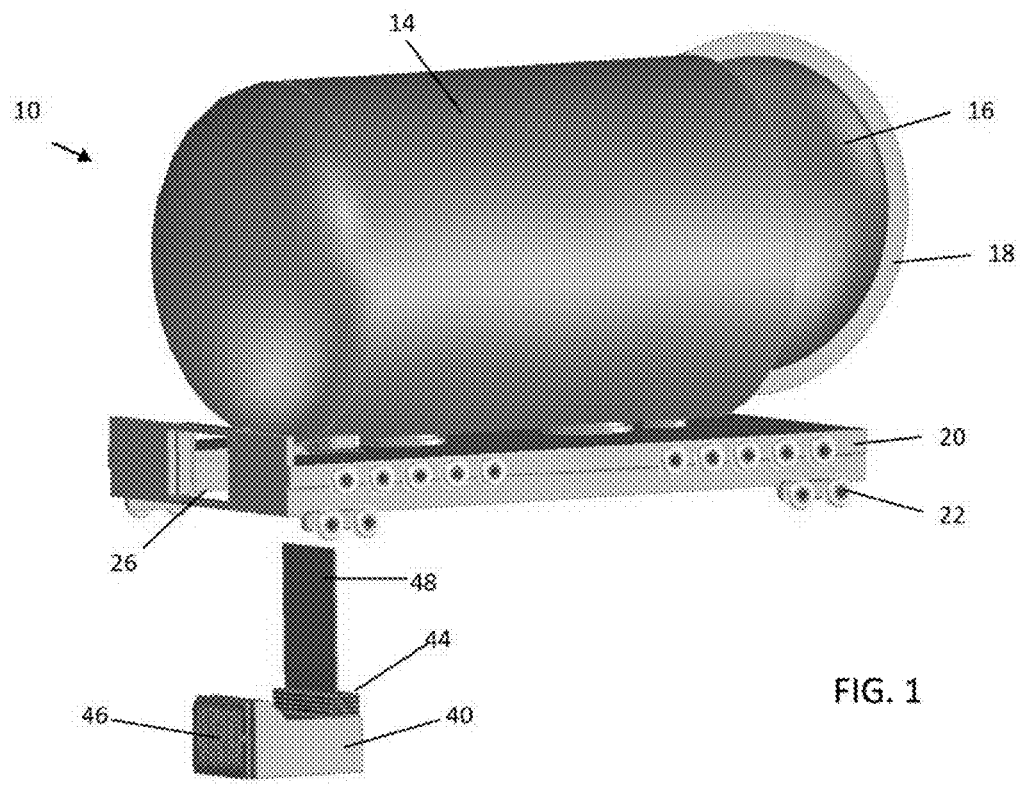
FIG. 1 is a perspective view of an embodiment of a vacuum tray and personality module in accordance with features of the present invention.
Figure 2:
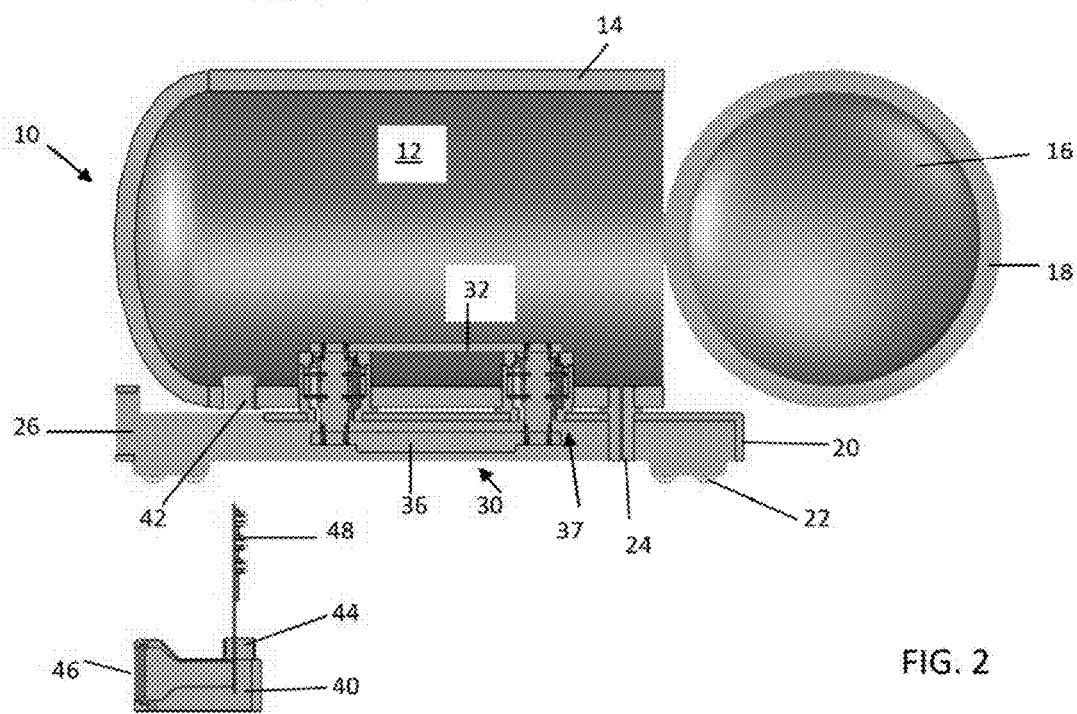
FIG. 2 is a side view of an example of the vacuum tray and personality module of the embodiment of FIG. 1.
Figure 3:
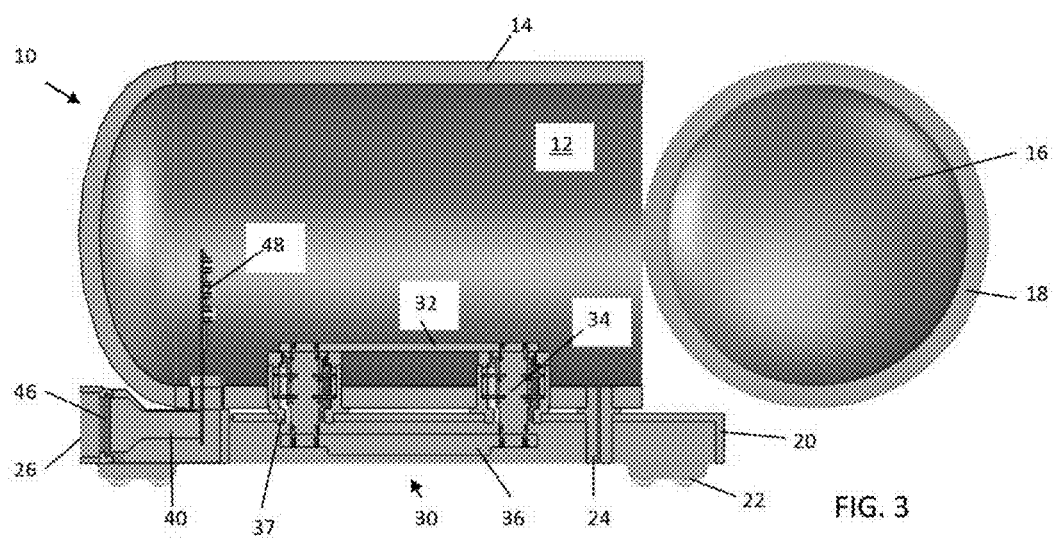
FIG. 3 is a side view of an example of the vacuum tray and installed personality module of the embodiment of FIGS. 1 and 2.

In the following detailed description, for purposes of explanation and not limitation, example embodiments disclosing specific details are set forth in order to provide a thorough understanding of an embodiment according to the present teachings. However, it will be apparent to one having ordinary skill in the art having the benefit of the present disclosure that other embodiments according to the present teachings that depart from the specific details disclosed herein remain within the scope of the appended claims. Moreover, descriptions of well-known apparatuses and methods may be omitted so as to not obscure the description of the example embodiments. Such methods and apparatuses are clearly within the scope of the present teachings.

The terminology used herein is for purposes of describing particular embodiments only, and is not intended to be limiting. The defined terms are in addition to the technical and scientific meanings of the defined terms as commonly understood and accepted in the technical field of the present teachings.

As used in the specification and appended claims, the terms 'a', 'an' and 'the' include both singular and plural referents, unless the context clearly dictates otherwise. Thus, for example, 'a device' includes one device and plural devices. As used in the specification and appended claims, and in addition to their ordinary meanings, the terms 'substantial' or 'substantially' mean to within acceptable limits or degree. As used in the specification and the appended claims and in addition to its ordinary meaning, the term 'approximately' means to within an acceptable limit or amount to one having ordinary skill in the art. For example, 'approximately the same' means that one of ordinary skill in the art would consider the items being compared to be the same.

Relative terms, such as "above," "below," "top," "bottom," "upper" and "lower" may be used to describe the various elements' relationships to one another, as illustrated in the accompanying drawings. These relative terms are intended to encompass different orientations of the device and/or elements in addition to the orientation depicted in the drawings. For example, if the device were inverted with respect to the view in the drawings, an element described as "above" another element, for example, would now be below that element. Similarly, if the device were rotated by 90° with respect to the view in the drawings, an element described "above" or "below" another element would now be "adjacent" to the other element; where "adjacent" means either abutting the other element, or having one or more layers, materials, structures, etc., between the elements.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Initially, it is noted that to provide quality assurance, semiconductor device makers may perform tests on their products to ensure that they meet their design parameters. Some of the types of tests routinely performed include device parametric testing, device logic function testing, and device timing testing. The semiconductor device being tested is commonly known as the Device Under Test (DUT) and the test system used in conducting the above tests on the DUT is commonly referred to as Automated Test Equipment (ATE).

In carrying out the tests on sensitive DUTs, environmental factors such as temperature and humidity may be controlled. In general, the ATE hardware is controlled by a computer which executes a test program to provide the correct voltages, currents, timings, and functional states to the DUT and measure the response from the DUT for each test. The result of each test is then compared to pre-defined limits and a pass/fail decision is made. As such, the ATE hardware normally includes a collection of power-supplies, meters, signal generators, pattern generators, etc.

In a typical ATE, a control computer including display, power supplies, I/O peripherals (e.g., data storage drives, printers), and some instrumentation are mounted in a rack console, which may be referred to below as test equipment.

Referring initially to FIGS. 1-6, a representative embodiment of a vacuum tray 10 will be described. The vacuum tray 10 is for use in testing a DUT 50, for example, in a testing system which will be described in further detail below. The vacuum tray 10 includes a vacuum chamber 12 configured to define a sealed vacuum environment around the DUT 50. The vacuum chamber 12 may be defined by a vessel 14 made of aluminum, steel and/or stainless steel, for example. The vacuum chamber 12 can be environmentally controlled as will be discussed.

The vessel 14 and vacuum chamber 12 may include a sealable access door 16 configured to allow access for loading and unloading DUTs 50 for testing. The sealable access door 16 may be attached with a hinge 19 (FIG. 6), for example, and may include a seal 18, and/or the vessel 14 may include a seal (not shown), as would be appreciated by those skilled in the art. As such, the vacuum chamber 12 includes the sealable access door 16 configured to allow access for loading and unloading the DUT 50 for testing.

A base 20 may be included to support the vacuum chamber 12 and is configured to provide relative movement, e.g. via wheels 22, between the vacuum tray 10 and the test equipment of the testing system. Wheels 22 are not necessary for the operation of the vacuum tray 10 and/or other aspects of the present embodiments. A vacuum interface 24 is carried by the vacuum chamber 12 and configured to connect to a vacuum pump of the testing system.

A DUT support 30 is carried by the vacuum chamber 12 and configured to support the DUT 50 within the vacuum chamber 12 during testing thereof. In various embodiments (with additional reference to FIG. 14), the DUT support 30 may include a pedestal 32 configured to hold the DUT 50 within the vacuum chamber 12 during transport and testing, including electrical testing and vibration testing, for example. The DUT support 30 may include an extension 34, coupled to the pedestal 32 and extending outside the vacuum chamber 12, and configured to connect to a vibration device of the testing system, which is described in more detail below.

Figure 14:
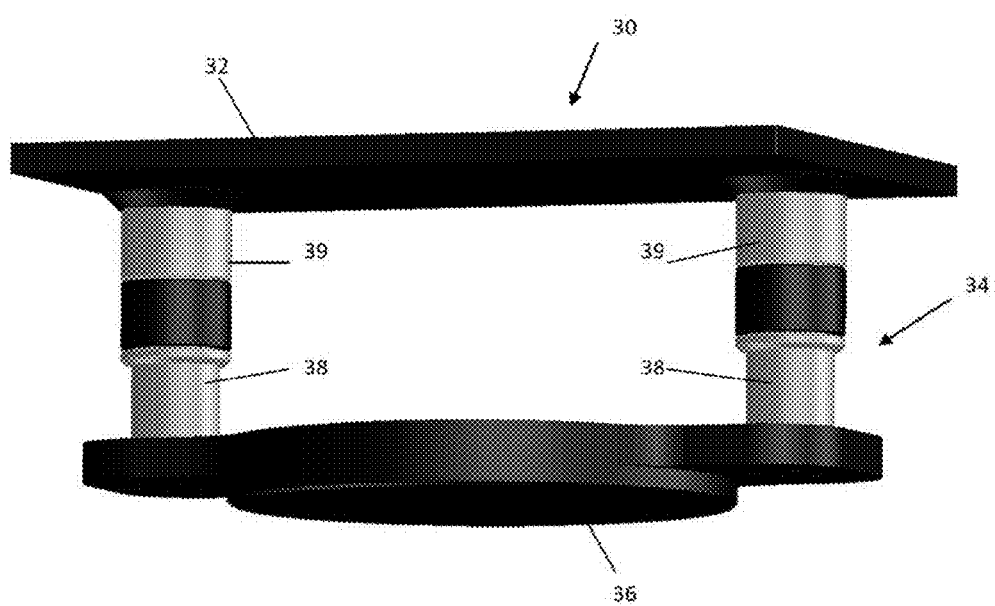
FIG. 14 is a perspective view of an embodiment of the pedestal of the vacuum chamber of the embodiments of FIGS. 1-6.

The extension 34 may include a vibration engagement interface 36, and the vacuum chamber 12 may include a sealing extension passage 37 that, together with the extension 34, provides a seal mechanism configured to allow the pedestal 32 to move between a rest position, when the vibration engagement interface 36 is not engaged with the vibration testing device, and a lifted position when the vibration engagement interface 36 is engaged with the vibration testing device. As illustrated in FIG. 14, the extension 34 of the DUT support 30 may include the use of a plurality of pillars 38 and associated bushings 39 to form portions of the sealing mechanism.

At least one electrical test interface unit 40 is carried by the vacuum chamber 12 and configured to connect between the DUT 50 and test equipment of the testing system. An opening 42 in the vessel 14 allows the electrical test interface unit 40 to be inserted therein. An appropriate seal 44 is provided to maintain the sealed environment during testing. As such, the electrical test interface 40 is removably insertable into the opening 42, which is sealable using the seal 44.

The electrical test interface unit 40 may be a personality module configured to provide for electrical connection with the DUT 50, provide for electrical connection (e.g. via connection 46) to the test equipment of the testing system, and provide conditioning information for controlling parameters to be used by the test equipment for testing the DUT.

The electrical test interface unit 40 or personality module includes connection 46 and/or any other desired devices, such as calibration circuitry, calibration data, error-correction circuitry/data, signal level setting, cable correction data, DUT identification data, etc. The electrical test interface unit 40 or personality module allows for connection to test equipment when it is inserted into opening 42 such that electrical terminals, e.g. of the connection 46, are positioned through opening 26 in the vacuum tray 10. The vacuum tray 10 may also include other electrical terminals, such as RF connectors etc.

Again, the electrical test interface unit 40 or personality module is for controlling test parameters with respect to the DUT 50. In the embodiment shown, connection 46 is electrically connected, e.g. via a printed circuit board, to connectors 48 which are for cross-connection from the DUT 50 to connection 46 which is arranged for interfacing with electrical terminals of test equipment. This may allow for connection 46 to be uniform for all personality modules which in-turn eliminates the need for specialized cables to be used for each different DUT even though the electrical terminals could be different for each DUT.

In addition, if the connection 46 is uniform across all DUTs it is easier to establish a blind-mate connection with the test equipment. This blind-mate connection can be achieved with human positioning of one or more vacuum trays into a test system or the positioning being accomplished by a robot or other automatic (non-human) system.

The electrical test interface unit 40 or personality module serves a number of different roles all such that a particular DUT can be conditioned to be tested using an interface connection between the DUT and the test equipment. Thus, when a particular DUT is to be tested, an electrical test interface unit 40 or personality module designed specifically for that particular DUT is selected and associated with the DUT.

Figure 4:
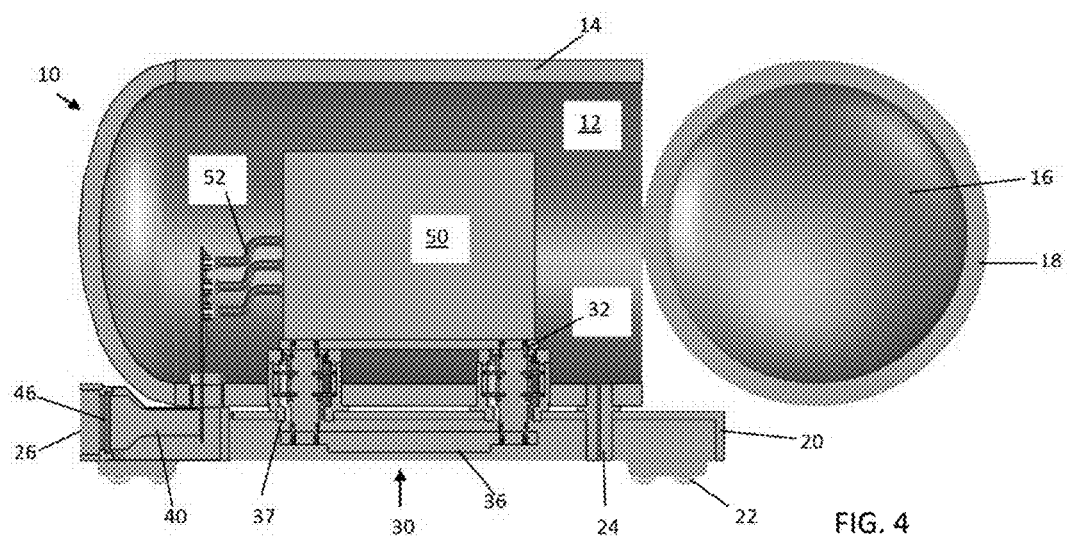
FIG. 4 is a side view of an example of the vacuum tray, installed personality module and loaded DUT of the embodiment of FIGS. 1 and 2.
Figure 5:
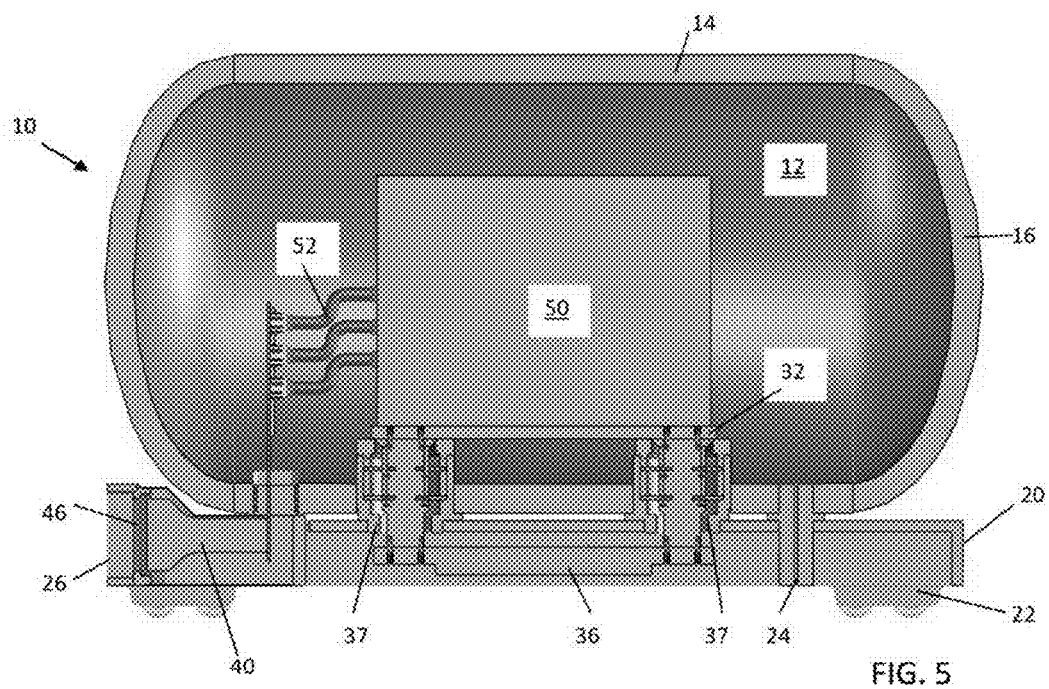
FIG. 5 is a side view of an example of the sealed vacuum chamber, installed personality module and loaded DUT of the embodiment of FIGS. 1 and 2.

As shown in FIG. 4, both the particular DUT 50 and the selected electrical test interface unit 40 or personality module are positioned within vacuum tray 10 in association with the DUT support 30 and pedestal 32 upon which the DUT 50 is held. The DUT 50 is electrically connected to the electrical test interface unit 40 using test cables 52, either permanently affixed to the electrical test interface unit 40 or connected thereto (as shown in FIGS. 4 and 5). The selected electrical test interface unit 40 or personality module is designed having circuitry (not shown) for providing conditioning information test signals from the connected test equipment and for optionally instructing the test equipment as to what test to be performed. Some of this conditioning information can take the form of control signals that can be, for example, calibration elements, calibration data, error-correction data, signal level setting data, power supply data, cable correction data, device identification etc.

In an automated or robotic situation, the electrical test interface unit 40 that is assigned to a vacuum tray 10 can also contain routing instructions for a robot so that the DUT 50 becomes connected to the desired test equipment. Thus, different DUTs can be assigned to different vacuum trays with each vacuum tray then receiving an electrical test interface unit 40 matching the DUT 50. When robotics are not used for tray movement purposes, the electrical test interface unit 40 continues to serve to condition the test equipment to set-up test requirements for the particular DUT 50 associated therewith.

In some embodiments, the electrical test interface unit 40 can have memory and processors and can be reprogrammed as required. In some embodiments, the electrical test interface unit 40 can be designed using ASICS or PROMs as desired. Wireless technology, such as RF, Bluetooth and near-field communication (NFC), can be used to change the programmed parameters.

Figure 6:
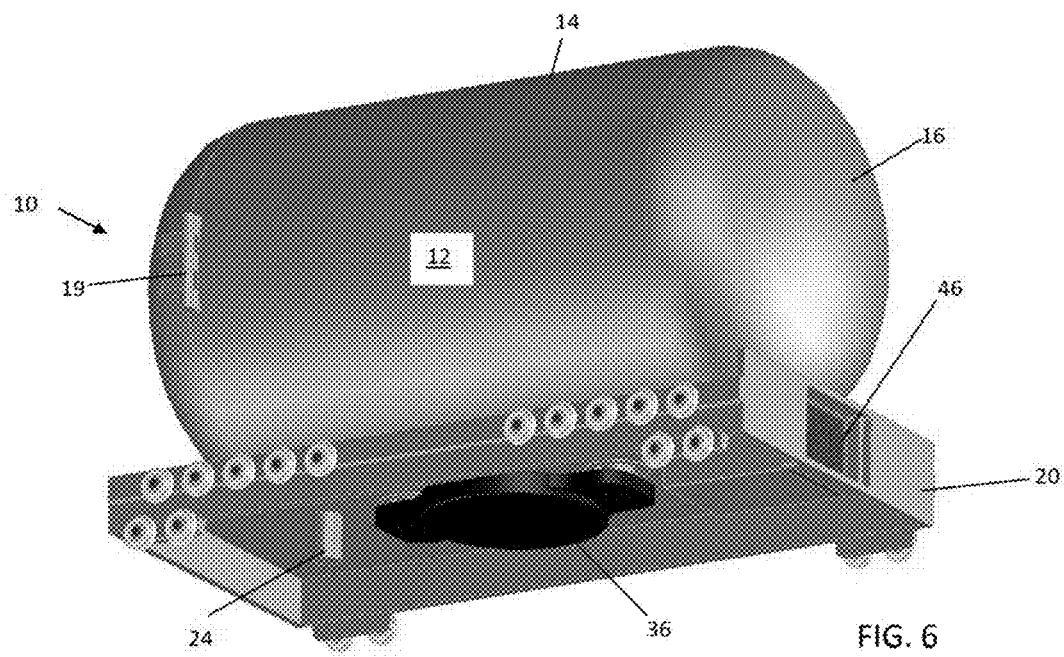
FIG. 6 is a perspective view of the vacuum tray including the base and various interfaces of the embodiment of FIGS. 1 and 2.
Figure 7:
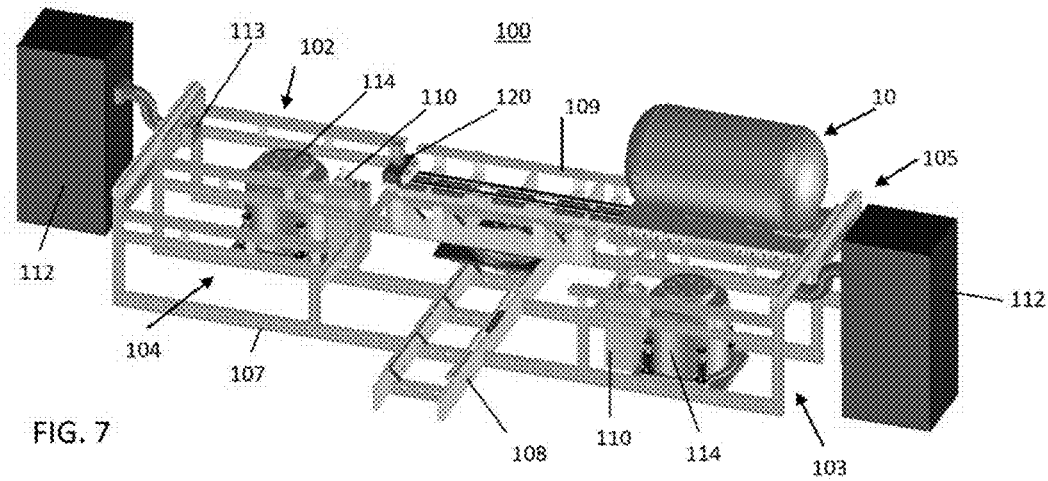
FIGS. 7-11 are perspective views of an embodiment of a system including an automated test line and the vacuum tray at various positions in accordance with features of the present invention.

Thus, as described, an electrical test interface unit 40 is inserted into the vacuum chamber 12 (FIGS. 2 and 3), the DUT 50 is loaded and test cables 52 are connected (FIG. 4), and the sealable access door 16 is closed to complete the sealing of the environment within the vacuum chamber 12 (FIG. 5). The perspective view of FIG. 6 shows the closed vacuum chamber, and illustrates the various exposed interfaces including the vacuum interface 24, the vibration engagement interface 36 and the connection 46 of the electrical test interface unit 40 through opening 26 in the base 20.

With particular reference to FIGS. 7-13, another embodiment will be described and is directed to a testing system 100 for testing a DUT 50. The testing system 100 is illustrated as a relatively small automated test line that includes only a few stations, e.g. two test positions 102 and 103, as well as two storage positions 104 and 105. It is noted that the testing system 100 according to the present invention is scalable and may include any number of test positions 102/103 and storage positions 104/105 as well as various other stations, such as manual operation positions (e.g. for loading/unloading, connecting etc.) as may be desired.

Embodiments may include the use of a frame 107 defining at least one of the storage positions 104/105 and/or at least one of the test positions 102/103 for the vacuum tray 10. The vacuum tray 10 includes the vacuum chamber 12 to define the sealed vacuum environment, and includes all the various features described above. The vacuum pump 110, testing equipment 112 and the vibration device 114 may be associated with the frame 107 at a same test position 102/103, as illustrated, or may be respectively associated with individual stations or in various combinations at various stations as may be desired.

Also, embodiments may include the use of a transport vehicle 109 for transporting the vacuum tray 10 between the storage position 104/105 and the test position 102/103. Such a transport vehicle 109 may be rotatable and operated to ride along a track 108. Of course, many other frame 107 and track 108 configurations are contemplated. A push/pull mechanism 120 may also be included in the transport vehicle 109 for engaging the vacuum tray 10 at an end of the base 20. The push/pull mechanism 120 is used to pull the vacuum tray 10 onto the transport vehicle 109, and to push the vacuum tray 10 off the transport vehicle 109 at the desired position.

Figure 8:
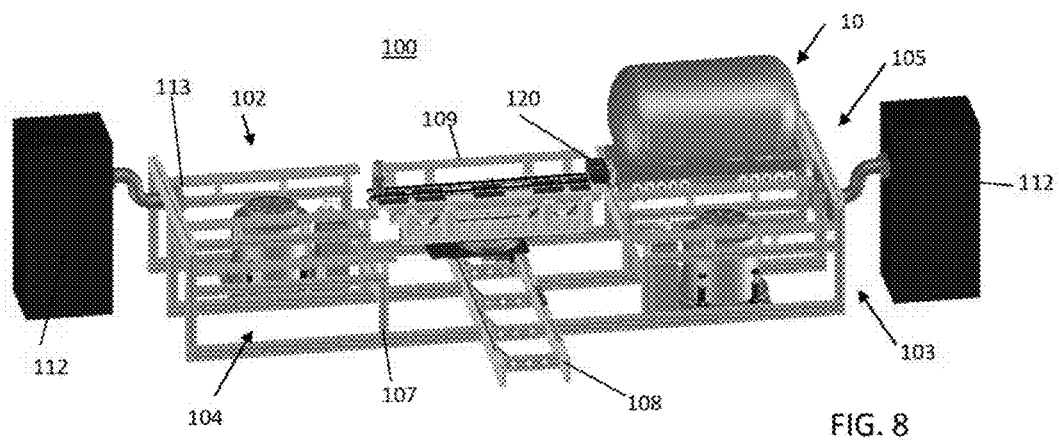

As illustrated in FIGS. 7-11, for example, the testing system 100, at each testing position 102/103, includes a respective vacuum pump 110, testing equipment 112 and a vibration device 114. The loaded vacuum tray 10 (e.g. with DUT 50 and corresponding electrical test interface unit 40 as described with reference to FIGS. 5 and 6) is docked at storage position 105 in FIG. 7. Then, the push/pull mechanism 120 of the transport vehicle 109 engages the loaded vacuum tray 10 at an end of the base 20 as shown in FIG. 8.

Figure 9:
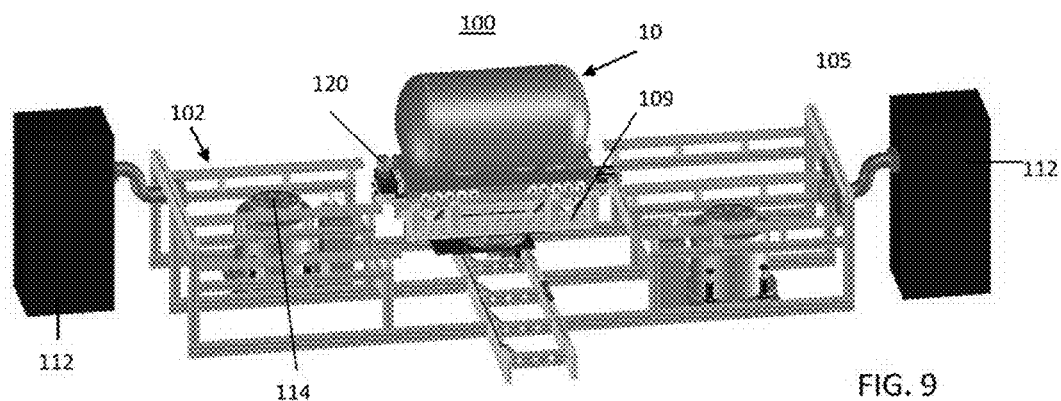
Figure 10:
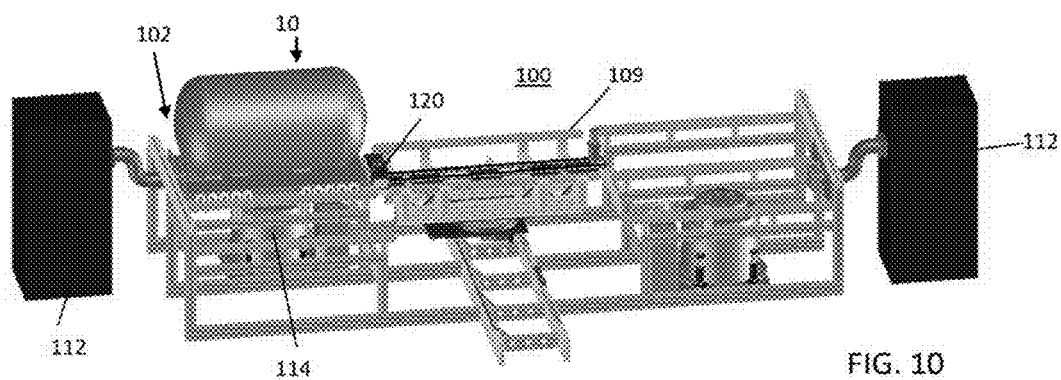

In FIG. 9, the push/pull mechanism 120 has pulled the loaded vacuum tray 10 out of the storage position 105 and onboard the transport vehicle 109. Then, the transport vehicle 109 may be rotated before the push/pull mechanism 120 pushes the loaded vacuum tray 10 off the transport vehicle 109 and into the test position 102 as shown in FIG. 10. Of course, transverse movement of the transport vehicle 109 along track 108 is also possible, for example, to deliver the vacuum tray 10 to test position 103.

Figure 11:
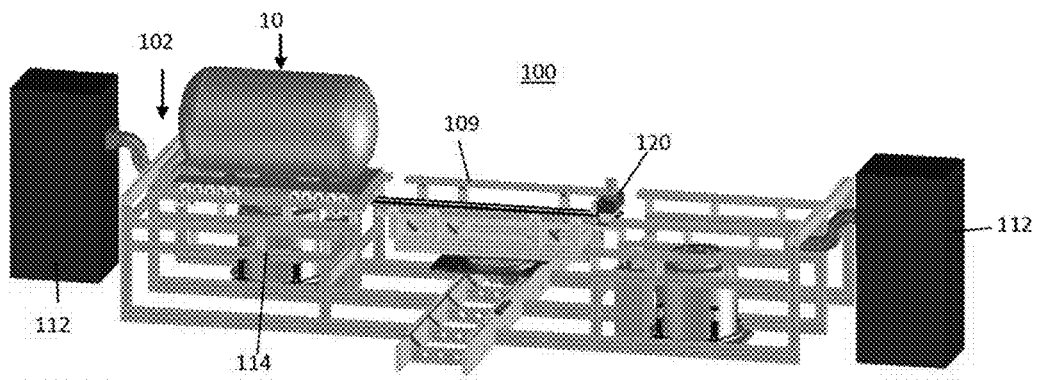

In FIG. 10, as the loaded vacuum tray 10 is pushed into the test position 102, the connection 46 of the electrical test interface unit 40, exposed through opening 26 in the base 20, is docked to the corresponding test equipment connection 113 of test equipment 112. The push/pull mechanism 120 may disengage the vacuum tray 10 as shown in FIG. 11.

Figure 12:
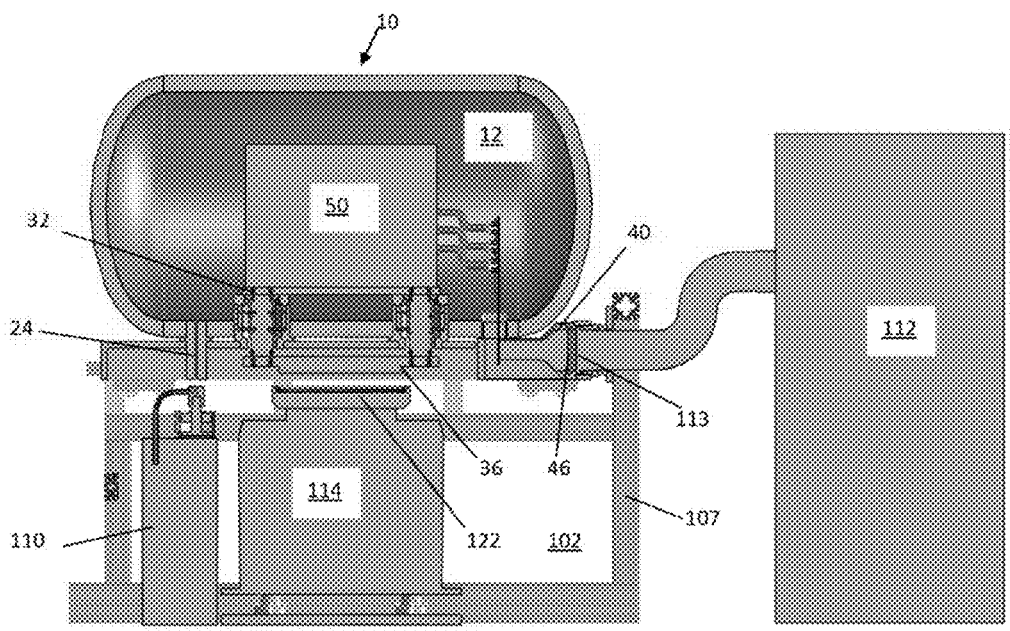
FIGS. 12 and 13 are enlarged side views of vacuum tray at the testing position in the system of FIGS. 7-11.

In the test position 102, the exposed interfaces of the vacuum tray 10, including the vacuum interface 24 and the vibration engagement interface 36, are respectively aligned with the vacuum pump 110 and vibration device 114 as shown in the enlarged view of FIG. 12. As described above, the DUT support 30 includes a pedestal 32 holding the DUT 50 within the vacuum chamber 12, and an extension 34 that extends outside the vacuum chamber 12 and is configured to connect to the vibration device 114.

Figure 13:
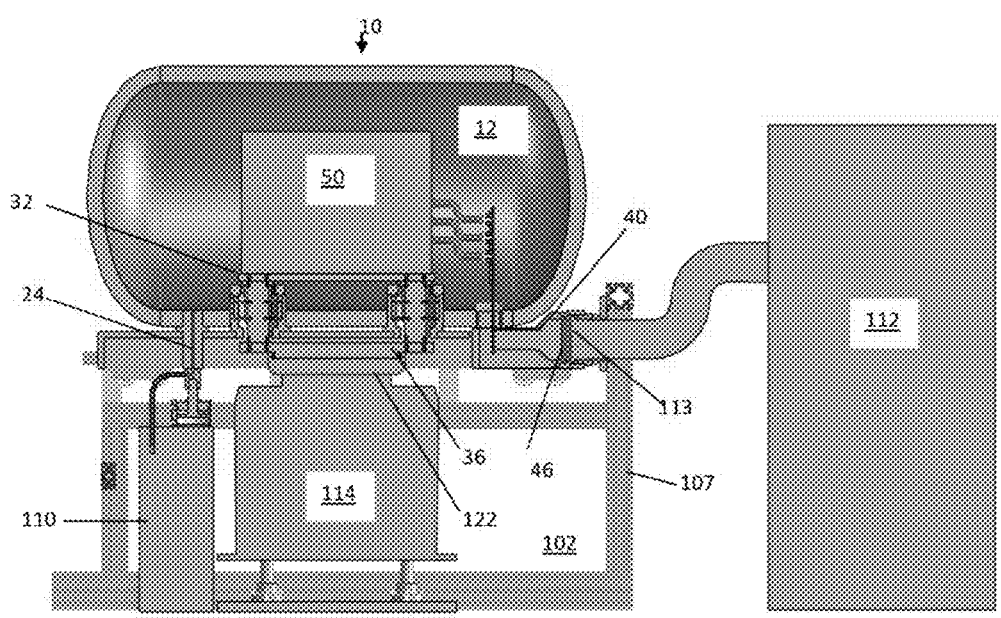

FIG. 13 shows an enlarged view of the testing system 100 in which a vibration device 114 is temporarily attached via connector 122 to the vibration engagement interface 36, at the distal end of DUT support 30 and pedestal 32, and which extends downward from vacuum chamber 12 through the base 20 of the vacuum tray 10. In this manner, the vibration device 114 can be maintained outside of any environment in which the DUT 50 is being tested.

Vibration device 114 can be any well-known vibrator or shaker operable for imparting a desired motion (or range of motions) at connector 122 thereby causing the DUT 50 to move in a controlled manner. In operation, in one embodiment, vibration device 114 (e.g. via an actuator) causes pedestal 32 to lift away from a surface of vacuum chamber 12 (e.g. as shown in FIG. 13), and then to move in one or more directions under control of connector 122 which extends from the vibration device 114. In the embodiment shown, vibration device 114 is in a fixed location and vacuum tray 10 is moved into proximity therewith for testing the DUT 50. However, the vibration device 114 could be portable and the vacuum tray fixed or both units could be portable and/or fixed, as would be appreciated by those skilled in the art.

The DUT 50 can be directly attached by clamping or otherwise held with a fixture to the pedestal 32. The sealing extension passage 37 of the vacuum chamber 12, together with the extension 34 of the DUT support 30, provides a seal mechanism configured to allow the pedestal 32 to move between a rest position (e.g. FIG. 12), when the vibration engagement interface 36 is not engaged with the vibration testing device 114, and a lifted position (e.g. FIG. 13) when the vibration engagement interface 36 is engaged with the vibration device 114. As illustrated in FIG. 14, the extension 34 of the DUT support 30 may include the use of a plurality of pillars 38 and associated bushings 39 to form portions of the sealing mechanism.

As discussed above, it is often necessary to couple DUTs to multiple test stations and to perform electrical and mechanical (vibrational) testing while subjecting the DUTs to the vacuum environments of high altitude or space. The extension 34, sealing extension passage 37, seal 44 of the electrical test interface unit 40 and seal 18 of the sealable access door 16 define portions of an overall sealing system for the vacuum chamber 12. Thus, when the vacuum pump 110 interfaces with the vacuum interface 24 of the vacuum chamber 12, the pressure within the sealed vacuum environment of vacuum chamber 12 can be controlled. Also, the temperature within the vacuum chamber 12 can be reliably controlled, i.e. heated or cooled.

In operation, when it is desired to perform vibration testing on a DUT 50 which has been attached to the proximal (top) end of pedestal 32, either the vacuum tray 10 is lowered so as to position vibration engagement interface 36, located at the distal end of DUT support 30, against connector 122, as discussed above, from vibration device 114, or the vibration device 114 is raised (hydraulically or pneumatically) so that the pedestal 32 is forced upward away from a surface of the vacuum chamber 12. Vibration engagement interface 36 and connector 122, as discussed can be releasably mated together so that whatever motion the vibration device 114 has imparted to connector 122 is ultimately imparted to the DUT 50 via the pedestal 32 when the vibration device is activated.

Figure 15:
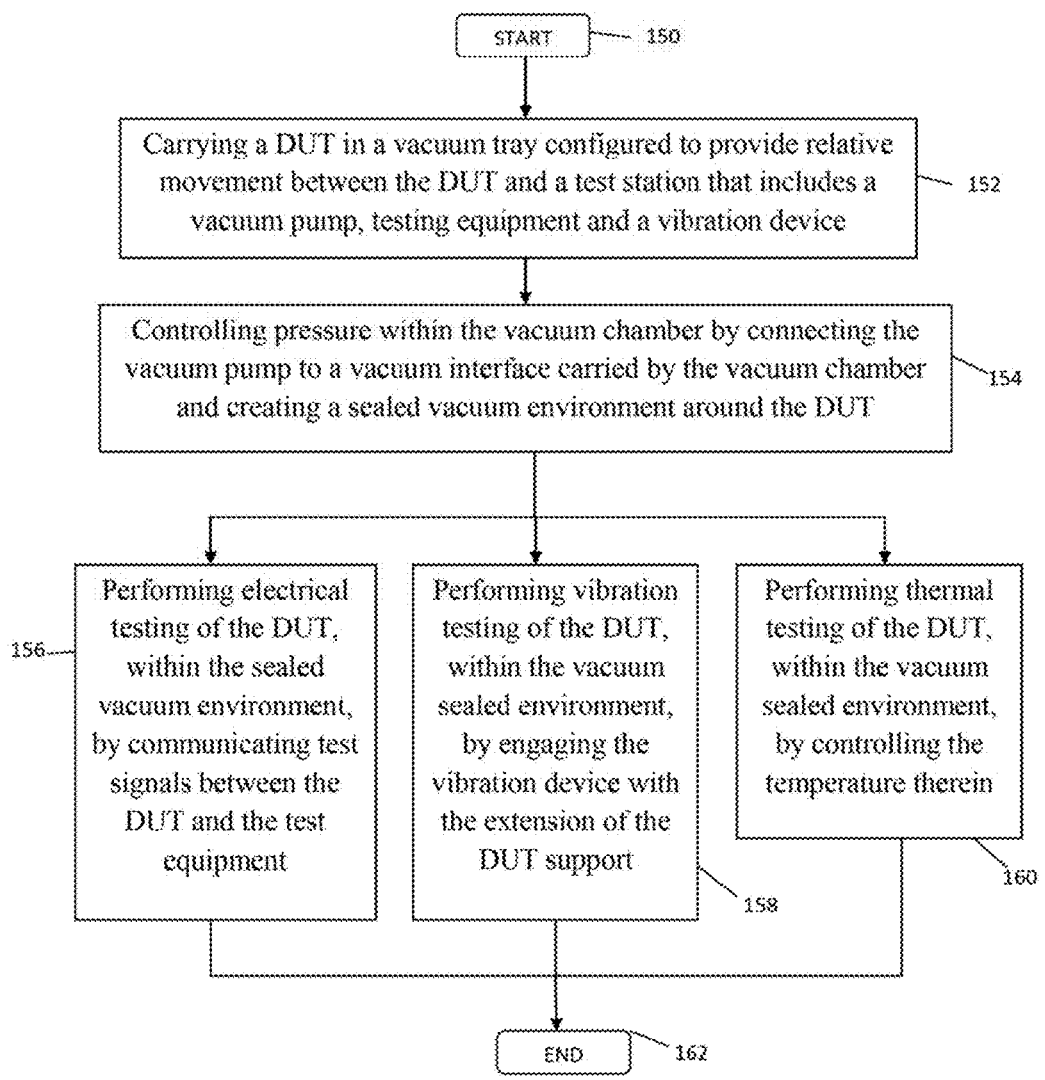
FIG. 15 is a flowchart illustrating a method of testing a DUT according to a representative embodiment.

Another embodiment is directed to a method for testing a DUT 50 and will be described with additional reference to the flowchart of FIG. 15. The method begins (block 150) and includes carrying a DUT 50 in a vacuum tray 10 configured to provide relative movement between the DUT 50 and a vacuum pump 110, testing equipment 112 and a vibration device 114 at block 152. Such step may include supporting the DUT 50 within a vacuum chamber 12, during testing thereof, on a DUT support 30 that includes a pedestal 32 to hold the DUT 50 within the vacuum chamber 12 during vibration testing, and an extension 34 that extends outside the vacuum chamber 12 and connects to the vibration device 114. At block 154, the method further includes controlling pressure within the vacuum chamber 12 by connecting the vacuum pump 110 to a vacuum interface 24 carried by the vacuum chamber 12 and creating a sealed vacuum environment around the DUT 50.

Furthermore, the method proceeds, at block 156 with performing electrical testing of the DUT 50, within the sealed vacuum environment, by communicating test signals between the DUT 50 and the test equipment 112 via at least one electrical test interface unit 40 carried by the vacuum chamber 12; and, at block 158, with performing vibration testing of the DUT 50, within the vacuum sealed environment, by engaging the vibration device 114 with the extension 34 of the DUT support 30.

Thermal testing may also be performed (block 160) by controlling the temperature within the vacuum chamber 12. The testing of steps 156, 158 and 160 may be performed individually or simultaneously, as needed, before the method ends at block 162.

The method may include loading and unloading the DUT 50 for testing via a sealable access door 16 in the vacuum chamber 12.

Embodiments may include the use of a frame 107 defining at least one storage position 104/105 and at least one test position 102/103 for the vacuum tray 10. The vacuum pump 110, testing equipment 112 and the vibration device 114 may be associated with the frame 107 at the test position 102/103. Also, as discussed above, embodiments may include transporting the vacuum tray 10 between the storage position 104/105 and the test position 102/103 with a transport vehicle 109.

The present embodiments provide devices, systems and methods that include the use of a portable vacuum chamber 12 which contains a DUT 50 and incorporates an electrical test interface unit 40, and may also include the use of a thermal and/or vibration DUT stimulus.

While representative embodiments are disclosed herein, one of ordinary skill in the art appreciates that many variations that are in accordance with the present teachings are possible and remain within the scope of the appended claim set. The invention therefore is not to be restricted except within the scope of the appended claims.

The invention claimed is:

1. A vacuum tray for use in testing a device under test (DUT) in a testing system, the vacuum tray comprising:
   a vacuum chamber configured to define a sealed vacuum environment around a DUT, wherein the vacuum chamber includes a sealable access door configured to allow access for loading and unloading the DUT for testing;
   a DUT support carried by the vacuum chamber and configured to support the DUT within the vacuum chamber during testing thereof;
   an electrical test interface unit comprising a printed circuit board configured to electrically connect a connection to connectors, wherein the connection is adapted to connect to electrical terminals of test equipment of the testing system, the electrical test interface unit being carried by the vacuum chamber and configured to connect between the DUT and test equipment of the testing system, wherein the electrical test interface is removably insertable into a sealable opening in the vacuum chamber;
   a vacuum interface carried by the vacuum chamber and configured to connect to a vacuum pump of the testing system; and
   an opening in the vacuum chamber configured to allow the electrical test interface unit to be inserted therein.

2. The vacuum tray of claim 1, wherein the vacuum chamber includes a sealable access door configured to allow access for loading and unloading DUTs for testing.

3. The vacuum tray of claim 1, wherein the DUT support comprises a pedestal configured to hold the DUT within the vacuum chamber during vibration testing.

4. The vacuum tray of claim 3, wherein the DUT support comprises an extension, coupled to the pedestal and extending outside the vacuum chamber, and configured to connect to a vibration device of the testing system.

5. The vacuum tray of claim 4, wherein the extension comprises a vibration engagement interface; and wherein the vacuum chamber includes a sealing extension passage that, together with the extension, provides a seal mechanism configured to allow the pedestal to move between a rest position, when the vibration engagement interface is not engaged with the vibration testing device, and a lifted position when the vibration engagement interface is engaged with the vibration testing device.

6. The vacuum tray of claim 1, wherein the electrical test interface unit comprises a personality module configured to provide for electrical connection with the DUT, provide for electrical connection to the test equipment of the testing system, and provide conditioning information for controlling parameters to be used by the test equipment for testing the DUT.

7. The vacuum tray of claim 1, further comprising a base supporting the vacuum chamber and the electrical test interface unit, and configured to provide relative movement between the vacuum tray and the test equipment of the testing system.

8. A testing system for testing a device under test (DUT), the testing system comprising:
   a vacuum pump;
   testing equipment;
   a vibration device;
   at least one vacuum tray configured to provide relative movement between the DUT and the vacuum pump, testing equipment and the vibration device, the at least one vacuum tray comprising:
- a vacuum chamber configured to define a sealed vacuum environment around the DUT, wherein the vacuum chamber includes a sealable access door configured to allow access for loading and unloading the DUT for testing;
- a DUT support carried by the vacuum chamber and configured to support the DUT within the vacuum chamber during testing thereof, wherein the DUT support comprises a pedestal configured to hold the DUT within the vacuum chamber during vibration testing, and an extension that extends outside the vacuum chamber and is configured to connect to the vibration device;
- an electrical test interface unit comprising a printed circuit board configured to electrically connect a connection to connectors, wherein the connection is adapted to connect to electrical terminals of test equipment of the testing system, the electrical test interface unit being carried by the vacuum chamber and configured to connect between the DUT and the test equipment, wherein the electrical test interface is removably insertable into a sealable opening in the vacuum chamber;
- a vacuum interface carried by the vacuum chamber and configured to connect to the vacuum pump; and
- an opening in the vacuum chamber configured to allow the electrical test interface unit to be inserted therein.

9. The testing system of claim 8, wherein the vacuum chamber includes a sealable access door configured to allow access for loading and unloading DUTs for testing.

10. The testing system of claim 8, wherein the extension comprises a vibration engagement interface; and wherein the vacuum chamber includes a sealing extension passage that, together with the extension, provides a seal mechanism configured to allow the pedestal to move between a rest position, when the vibration engagement interface is not engaged with the vibration testing device, and a lifted position when the vibration engagement interface is engaged with the vibration testing device.

11. The testing system of claim 8, wherein the electrical test interface unit comprises a personality module configured to provide for electrical connection with the DUT, provide for electrical connection to the test equipment, and provide conditioning information for controlling parameters to be used by the test equipment for testing the DUT.

12. The testing system of claim 8, further comprising a frame defining at least one storage position and at least one test position for the vacuum tray.

13. The testing system of claim 12, wherein the vacuum pump, testing equipment and the vibration device are associated with the frame at the at least one test position.

14. The testing system of claim 12, further comprising a transport vehicle configured to transport the vacuum tray between the at least one storage position and the at least one test position.

15. A method for testing a device under test (DUT), the method comprising:
- carrying a DUT in a vacuum tray configured to provide relative movement between the DUT and a vacuum pump, testing equipment and a vibration device, and including supporting the DUT within a vacuum chamber, during testing thereof, on a DUT support that includes a pedestal to hold the DUT within the vacuum chamber during vibration testing, and an extension that extends outside the vacuum chamber and connects to the vibration device, wherein the vacuum chamber includes a sealable access door configured to allow access for loading and unloading the DUT for testing;
- controlling pressure within the vacuum chamber by connecting the vacuum pump to a vacuum interface carried by the vacuum chamber and creating a sealed vacuum environment around the DUT;
- inserting an electrical test interface unit through an opening in the vacuum chamber, the electrical test interface unit comprising a printed circuit board configured to electrically connect a connection to connectors, wherein the electrical test interface is removably insertable into a sealable opening in the vacuum chamber, and the connection is adapted to connect to electrical terminals of test equipment; performing electrical testing of the DUT, within the sealed vacuum environment, by communicating test signals between the DUT and the test equipment via the electrical test interface unit carried by the vacuum chamber; and
- performing vibration testing of the DUT, within the vacuum sealed environment, by engaging the vibration device with the extension of the DUT support.

16. The method of claim 15, further comprising loading and unloading the DUT for testing via a sealable access door in the vacuum chamber.

17. The method of claim 15, wherein the extension comprises a vibration engagement interface; and wherein the vacuum chamber includes a sealing extension passage that, together with the extension, provides a seal mechanism configured to allow the pedestal to move between a rest position, when the vibration engagement interface is not engaged with the vibration testing device, and a lifted position when the vibration engagement interface is engaged with the vibration testing device.

18. The method of claim 15, wherein the electrical test interface unit comprises a personality module configured to provide for electrical connection between the DUT and the test equipment, and provide conditioning information for controlling parameters to be used by the test equipment for testing the DUT.

19. The method of claim 15, further comprising providing a frame defining a storage position and a test position for the vacuum tray.

20. The method of claim 19, further comprising transporting the vacuum tray between the storage position and the test position with a transport vehicle.

* * * * *